Aug. 11, 1964 D. J. SIKORRA 3,144,564

CASCADED DIFFERENTIAL AMPLIFIERS WITH POSITIVE AND NEGATIVE FEEDBACK

Filed Dec. 29, 1960

INVENTOR.
DANIEL J. SIKORRA

BY Roger W. Hansen

ATTORNEY

United States Patent Office 3,144,564
Patented Aug. 11, 1964

3,144,564
CASCADED DIFFERENTIAL AMPLIFIERS WITH POSITIVE AND NEGATIVE FEEDBACK

Daniel J. Sikorra, Champlin, Minn., assignor to Minneapolis-Honeywell Regulator Company, Minneapolis, Minn., a corporation of Delaware Filed Dec. 29, 1960, Ser. No. 79,350
10 Claims. (Cl. 307—88.5)

This invention pertains to an novel amplifier circuit and more particularly to an amplifier circuit wherein the amplifier output has a component proportional to an approximate time derivative or a time integral of the input signal.

In a broad sense, the invention comprises two difference amplifiers so designed that the output terminals of the second difference amplifier and the input terminals of the first difference amplifier are at substantially the same potential when no input signal is applied to the overall amplifier. Therefore, feedback networks connected between the output of the second difference amplifier and the input of the first difference amplifier will have no initial current through them or potential across then in the absence of an input signal. A difference amplifier is a device having an output proportional to the algebraic difference of the input signals applied thereto.

It is one object of this invention to provide an amplifier having an output component which is the approximate time integral or approximate time derivative of the input signal.

Another object of this invention is to provide a highly stable feedback amplifier which utilizes both positive and negative feedback.

A further object of this invention is to provide an amplifier wherein the output and input circuits are biased to substantially the same potential in the absence of an input signal.

These and further objects of my invention will be apparent to those skilled in the art upon consideration of the accompanying specification, claims and drawings of which:

Figure 1:
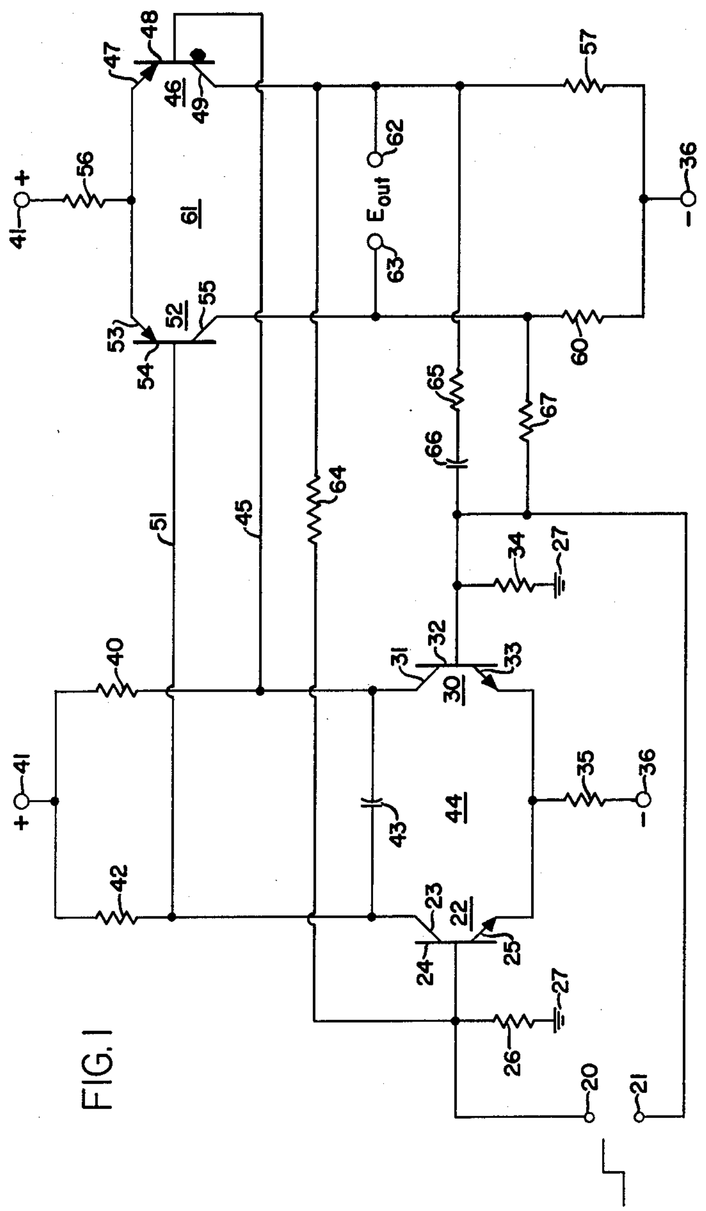
FIGURE 1 is a schematic diagram of an embodiment of this invention utilizing both positive and negative feedback elements.

Referring to FIGURE 1 there is shown a difference amplifier having a pair of input terminals 20 and 21. Input terminal 20 is directly connected to a base 24 of a current-control device, in this case a transistor, 22. Transistor 22 further has a collector 23 and an emitter 25. Base 24 is also connected by means of a resistor 26 to a common conductor 27, in this case ground. Input terminal 21 is directly connected to a base 32 of a transistor, or similar current-control device, 30, and by means of a resistor 34 to ground 27. Transistor 30 further has a collector 31 and an emitter 33.

Emitter 33 of transistor 30 is connected directly to emitter 25 of transistor 22. Emitters 33 and 25 are further connected by means of a resistor 35 to a negative source of energizing potential 36. Collector 31 of transistor 30 is connected by means of an impedance, in this case a resistor 40, to a positive source of energizing potential 41. Collector 23 of transistor 22 is connected by means of a resistor, or similar impedance, 42 to the positive potential source 41. A capacitor 43 is connected directly between collectors 23 and 31 of transistors 22 and 30 to minimize the tendency toward high frequency oscillations. Transistors 22 and 30 and their associated circuitry comprise a first difference amplifier 44.

Collector 31 of transistor 30 is connected by means of a conductor 45 to a base 48 of a transistor, or similar current-control device, 46. Transistor 46 further has an emitter 47 and a collector 49. Collector 23 of transistor 22 is further connected by means of a conductor 51 to a base 54 of a transistor, or similar current-control device, 52. Transistor 52 further has an emitter 53 and a collector 55. Emitter 53 of transistor 52 is connected directly to emitter 47 of transistor 46. Emitters 47 and 53 are further connected by means of a resistor 56 to the positive potential source 41. Collector 49 of transistor 46 is connected by means of a resistor 57 to the negative source of energizing potential 36. Collector 55 of transistor 52 is connected by means of a resistor 60 to the negative potential source 36. Transistors 46 and 52 and their associated circuitry comprise a second dfference amplifier 61.

Collector 49 of transistor 46 is further connected to a first output terminal 62, while collector 55 of transistor 52 is connected to a second output terminal 63.

Collector 49 of transistor 46 is further connected by means of a first feedback network, in this case a resistor 64 to the base 24 of transistor 22, and by means of a second feedback network comprising a resistor 65 in series with a capacitor 66 to the base 32 of transistor 30. Collector 55 of transistor 52 is connected by means of a third feedback network comprising resistor 67 to the base 32 of transistor 30.

Difference amplifier 61 is designed to that the collectors 49 and 55 of transistors 46 and 52 are substantially at zero potential with respect to ground when no input signal is applied to the amplifier. Similarly difference amplifier 44 is designed so that the bases 24 and 32 of transistors 22 and 30 are also at substantially zero potential with respect to ground when no input signal is applied to input terminals 20 and 21.

Since collectors 49 and 55 and bases 24 and 32 are all at substantially zero potential with respect to ground when there is no input signal at input terminals 20 and 21, the feedback networks connected from the collectors 49 and 55 to the bases 24 and 32 will have substantially no current through them or potential across them when there is no input signal applied to input terminals 20 and 21.

*Operation*

The amplifier utilizing the feedback arrangement as shown in FIGURE 1 produces an output having a first component proportional to the input signal and a second component corresponding to the approximate time derivative of the input signal. When no input signal is applied to input terminals 20 and 21 transistors 22, 30, 46, and 52 will be conducting some value of quiescent operating current, and, as explained previously, the collectors 49 and 55 of transistors 46 and 52 and the bases 24 and 32 of transistors 22 and 30 are all at substantially zero or ground potential.

Assume that a positive step input current signal is applied to the input terminals 20 and 21 such that terminal 20 is positive with respect to terminal 21. This signal will bias transistors 22 and 30 such that the conduction of transistor 22 increases while the conduction of transistor 30 decreases. The current flow path for transistor 22 is from the positive potential source 41 through resistor 42, collector 23 to emitter 25 of transistor 22, and resistor 35 to the negative source 46. Similarly, the current flow path for transistor 30 is from the positive potential source 41 through resistor 40, collector 31 to emitter 33 of transistor 30, and resistor 35 to the negative potential source 36. The increase in conduction of transistor 22 causes conductor 51 to become less positive, while the decrease in conduction of transistor 30 causes conductor 45 to become more positive. The negative going voltage on conductor 51 biases transistor 52 so as to increase the conduction of this transistor, while the positive going potential on conductor 45 biases transistor 46 so as to decrease the conduction of this transistor. The current flow path for transistor 52 is from the positive potential source 41 through resistor 56, emitter 53 to collector 55 of transistor 52, and resistor 60 to the negative potential source 36. The current flow path for transistor 46 is from the positive potential source 41 through resistor 56, emitter 47 to collector 49 of transistor 46, and resistor 57 to the negative potential source 36. The increase in conduction of transistor 52 causes the collector 55 of this transistor to go more positive, while the decrease in conduction of transistor 46 causes its collector 49 to go more negative.

When the potential on the collector 49 of transistor 46 goes more negative a current will flow from ground 27 through resistor 34, and from base 32 of transistor 30, through capacitor 66, resistor 65, and resistor 57 to the negative potential source 36. This current flow through the feedback network biases the base 32 of transistor 30 so as to further dercease the conduction of transistor 30. It can be seen that this current is a positive or regenerative feedback. Since with no input signal the base 32 of transistor 30 and the collector 49 of transistor 46 were at substantially the same potential, there was no initial charge on capacitor 66. Therefore, at the first instant the input signal is applied, capacitor 66 acts substantially as a short circuit and the value of the positive feedback is maximum. As capacitor 66 charges the amount of positive feedback decreases.

The decrease in potential on the collector 49 of transistor 46, due to the application of an input signal, causes a proportional current flow from ground 27 through resistor 26 and from base 24 of transistor 22, through resistor 64, and resistor 57 to the negative potential source 36. This current flow through resistor 26 biases the base 24 of transistor 22 so as to decrease the conduction of transistor 22. Since this bias has the opposite effect or in other words opposes the input signal, this feedback is negative or degenerative. The increase of potential on the collector 55 of transistor 52 when the input signal is applied to input terminals 20 and 21 causes a current flow from the positive source 41 through resistor 56, emitter 53 to collector 55 of transistor 52, resistor 67, and reistor 34 to ground 27 and base 32 of transistor 30. This current flow through resistor 34 tends to bias the base 32 of transistor 30 so as to increase conduction of transistor 30. Since this bias opposes the input signal, this feedback current is also a negative or degenerative feedback.

Figure 3:
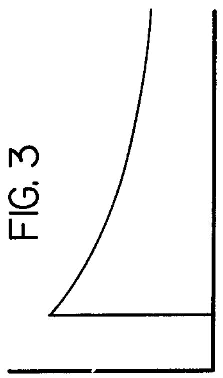
FIGURE 3 is a representation of the time variant output of the amplifier of FIGURE 1 in response to a step input.

As stated before, the positive feedback signal through capacitor 66 and resistor 65 is maximum at the initial instant the input signal is applied since at this time capacitor 66 is uncharged. The positive feedback through resistor 65 and capacitor 66 and the dual negative feedback through resistor 64 and resistor 67 can be made substantially equal at the initial instant the input signal is applied so that they tend to cancel each other. Since the two feedback signals, that is, the positive and the negative feedbacks, tend to cancel each other, it has the same effect as not having any feedback at all and consequently the output signal across the output terminals 62 and 63 will tend to be directly proportional to the input signal applied at input terminals 20 and 21. However, as the capacitor 66 in the positive feedback loop begins to charge, the amount of positive feedback decreases and hence the negative feedback through resistors 64 and 67 begins to dominate. This effective increase in the negative feedback tends to decrease the overall gain of the amplifier and hence the output signal across the output terminals 62 and 63 will begin to decrease at an exponential rate determined by the exponential decrease in the positive feedback due to the charging of capacitor 66. The output wave-form across the output terminals 62 and 63 is shown in FIGURE 3. From this figure it can be seen that when the positive and negative feedback loops described above are utilized in the amplifier, the output signal has a first component proportional to the input signal and a second component corresponding approximately to the time derivative of the input signal.

Figure 2:
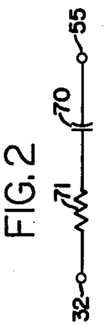
FIGURE 2 is a schematic representation of another feedback element suitable for use in the amplifier.
Figure 4:
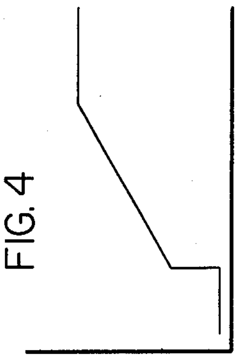
FIGURE 4 is a representation of the output of the amplifier in response to a step input when the feedback network of FIGURE 2 is utilized.

FIGURE 2 shows a feedback circuit comprising a capacitor 70 connected in series with a resistor 71. If this feedback network is connected between the collector 55 of transistor 52 and the base 32 of transistor 30 as indicated, and if feedback resistors 64, 65, 67, and feedback capacitor 66 are removed from the circuit, the amplifier will produce an output having a first component proportional to the input signal and a second component corresponding approximately to the time integral of the input signal as shown in FIGURE 4.

To explain the operation of the amplifier when the feedback circuit of FIGURE 2 is connected in the circuit, assume that a step input signal is applied to the amplifier input terminals 20 and 21 such that terminal 20 is positive going with respect to terminal 21. Then, as explained herein before, the potential at the collector 49 of transistor 46 will decrease, while the potential at the collector 55 of transistor 52 will increase. When the potential on the collector 55 of transistor 52 increases, a current will flow from positive potential source 41 through resistor 56, emitter 53 to collector 55 of transistor 52, capacitor 70, resistor 71, resistor 34 to ground and base 32 of transistor 30. This current flow biases the base 32 of transistor 30 so as to increase the conduction of transistor 30. Since this feedback current has the opposite effect on transistor 30 as does the input signal applied to input terminals 20 and 21, the feedback current is a negative or degenerative feedback. Since, as explained previously, the collector 55 of transistor 52 and the base 32 of transistor 30 were at the same potential before the input signal was applied, there was initially no charge on capacitor 70. Therefore, the feedback current will be maximum at the initial instant the input signal is applied. This large initial negative feedback current decreases the overall gain of the amplifier. As capacitor 70 begins to charge, however, the negative feedback current decreases and the gain of the amplifier increases. The gain of the amplifier will continue to increase until capacitor 70 is completely charged. The output wave form appearing across output terminals 62 and 63 is shown in FIGURE 4. From this figure it can be seen that the amplifier output voltage has a first component proportional to the input signal and a second component corresponding to the time integral of the input signal.

The proportional component of the output can be decreased or eliminated by decreasing the value of resistor 71, and an output corresponding to the time integral of the input signal can be obtained.

It is to be understood that while I have shown a specific embodiment of my invention, this is for the purpose of illustration only and that my invention is to be limited solely by the scope of the appended claims.

I claim as my invention:

1. An amplifier comprising: first and second difference amplifiers each having input and output terminals; means connecting the output terminals of said first difference amplifier to the input terminals of said second difference amplifier; means adapted to connect the input terminals of said first difference amplifier to a source of input signals; means biasing the output terminals of said second difference amplifier to substantially zero potential during a no-signal condition; means biasing the input terminals of said first difference amplifier to substantially zero potential during a no-signal condition; and feedback means connected from the output terminals of the second difference amplifier to the input terminals of said first difference amplifier.

2. An amplifier for producing an output having a first component proportional to the amplifier input signal and a second component corresponding approximately to the time integral of the input signal comprising; input terminals; output terminals; means biasing said input and output terminals to a substantially zero potential when no signal is present at the amplifier input; resistance means; capacitance means; and means serially connecting said resistance means and said capacitance means from said output terminals to said input terminals so as to produce a degenerative feedback current.

3. An amplifier for producing an output having a first component proportional to the amplifier input and a second component corresponding approximately to the time derivative of the input signal comprising: input terminals; output terminals; means biasing said input and output terminals to a substantially zero potential when no signal is present at the amplifier input; capacitance means; first resistance means; means serially connecting said first resistance means and said capacitance means from one of said output terminals to one of said input terminals so as to produce a regenerative feedback current; second resistance means; and means connecting said second resistance means between said output terminals and said input terminals so as to produce a degenerative feedback current.

4. An amplifier comprising: first and second difference amplifiers each having a differential input and a differential output; means connecting the output of said first difference amplifier to the input of said second difference amplifier; means biasing the output of said second difference amplifier and the input of said first difference amplifier to substantially the same potential at all times except when an input signal is applied to the input terminals of said first difference amplifier; and feedback means regeneratively connected between the output of said second difference amplifier and the input of said first difference amplifier.

5. An amplifier of the class described comprising: first, second, third and fourth current control means each having an input electrode, an output electrode and a common electrode; a first source of energizing potential; first and second impedance means respectively connecting the output electrodes of said first and second current control means to said first potential source; a second source of energizing potential; third impedance means connecting the common electrodes of said first and second current control means to said second potential source; means connecting the input electrodes of said first and second current control means to a reference potential; means adapted to further connect the input electrodes of said first and second control means to a source of input signals; means respectively connecting the output electrodes of first and second current control means to the input electrodes of said third and fourth current control means; fourth impedance means connecting the common electrode of said third and fourth current control means to said first source of energizing potential; fifth and sixth impedance means respectively connecting the output electrodes of said third and fourth control means to said second potential source so that said output electrodes are biased to substantially the same potential as the input electrodes of said first and second control means at all times except when an input signal is applied to the input electrodes of said first and second control means; and feedback means connected between the output electrodes of said third and fourth control means and the input electrodes of said first and second current control means.

6. An electronic amplifier comprising: first and second difference amplifiers each having input and output terminals; means connecting the output terminals of said first difference amplifier to the input terminals of said second difference amplifier; means adapted to connect the input terminals of said first difference amplifier to a source of input signals; means biasing the output terminals of said second difference amplifier and the input terminals of said first difference amplifier to substantially the same potential during a no-signal condition; and feedback means connected from the output terminals of the second difference amplifier to the input terminals of said first difference amplifier.

7. An electronic amplifier for producing an output having a first component proportional to the amplifier input signal and a second component corresponding to the time integral of the input signal comprising: input terminals; output terminals; means biasing said input and output terminals to a substantially zero potential when no signal is present at the amplifier input; impedance means; reactance means; and means serially connecting said impedance means and said reactance means from said output terminals to said input terminals so as to produce a degenerative feedback current.

8. An amplifier for producing an output having a first component proportional to the amplifier input and a second component corresponding to the approximate time derivative of the input signal comprising: input terminals; output terminals; means biasing said input and output terminals to a substantially zero potential when no signal is present at the amplifier input; reactance means; impedance means; and means serially connecting said impedance means and said reactance means from said output terminals to said input terminals so as to produce a positive feedback current.

9. An amplifier comprising: an input circuit; an output circuit; feedback means connected between said output circuit and said input circuit to provide both a degenerative and a regenerative feedback signal; and means biasing said output circuit and said input circuit to substantially the same potential at all times except when an input signal is applied to said amplifier.

10. An amplifier comprising: first and second difference amplifiers each having a differential input and a differential output; means connecting the output of said first difference amplifier to the input of said second difference amplifier; means biasing the output of said second difference amplifier and the input of said first difference amplifier to substantially the same potential at all times except when an input signal is applied to the input terminals of said first difference amplifier; and feedback means degeneratively connected between the output of said second difference amplifier and the input of said first difference amplifier.

References Cited in the file of this patent

UNITED STATES PATENTS

| | | |
|---|---|---|
| 2,401,779 | Swartzel | June 11, 1946 |
| 2,677,729 | Mayne | May 4, 1954 |
| 2,757,283 | Ingerson et al. | July 31, 1956 |
| 2,779,871 | Patterson | Jan. 29, 1957 |
| 2,846,522 | Brown | Aug. 5, 1958 |
| 2,909,623 | Blecher | Oct. 20, 1959 |